United States Patent [19]

Yokoyama et al.

[11] Patent Number: 5,198,154

[45] Date of Patent: Mar. 30, 1993

[54] HIGH TEMPERATURE BAKING PASTE

[75] Inventors: Akinori Yokoyama, Kurashiki; Tsutomu Katsumata; Hitoshi Nakajima, both of Yokohama, all of Japan

[73] Assignee: Asahi Kasei Kogyo Kabushiki Kaisha, Osaka, Japan

[21] Appl. No.: 773,927

[22] PCT Filed: Mar. 18, 1991

[86] PCT No.: PCT/JP91/00363

§ 371 Date: Nov. 5, 1991

§ 102(e) Date: Nov. 5, 1991

[87] PCT Pub. No.: WO91/15018

PCT Pub. Date: Oct. 3, 1991

[30] Foreign Application Priority Data

Mar. 19, 1990 [JP] Japan .................................. 2-067197

[51] Int. Cl.$^5$ .............................................. H01B 1/06
[52] U.S. Cl. .................... 252/514; 252/512; 252/518; 420/483; 420/502; 428/547; 428/610
[58] Field of Search ............... 252/512, 513, 514, 518; 75/352, 338; 420/483, 491, 497, 502; 428/547, 610; 106/1.18, 1.19, 1.26, 1.05

[56] References Cited

U.S. PATENT DOCUMENTS

| | | | |
|---|---|---|---|
| 4,485,153 | 11/1984 | Janikowski | 428/688 |
| 4,728,580 | 3/1988 | Grasselli et al. | 428/610 |
| 5,091,114 | 2/1992 | Nakajima et al. | 252/514 |

FOREIGN PATENT DOCUMENTS

| | | |
|---|---|---|
| 52-71531 | 6/1977 | Japan . |
| 53-101687 | 9/1978 | Japan . |
| 62-140304 | 6/1987 | Japan . |

*Primary Examiner*—Paul Lieberman
*Assistant Examiner*—M. Kopec
*Attorney, Agent, or Firm*—Jacobson, Price, Holman & Stern

[57] ABSTRACT

A composition, which comprises copper alloy powder represented by a general formula $Ag_xCu_yM_z$ (where M represents one or more metals selected from Pb, Bi and Zn; x, y and z are atomic ratio values, respectively; and $0.001 \leq x \leq 0.4$, $0.6 \leq y \leq 0.999$, $0 \leq z \leq 0.05$ and $x+y+z=1$) having particle surface silver concentration higher than the average silver concentration thereof and a region in which a silver concentration increases toward the particle surface, glass frit and an organic vehicle, is useful for pastes for screen printing, electroconductive circuits, electrodes, electromagnetic wave shields and an electroconductive pastes for a resistance contacts.

13 Claims, No Drawings

HIGH TEMPERATURE BAKING PASTE

TECHNICAL FIELD

The present invention relates to less expensive electroconductive compositions having excellent electroconductivity, oxidation resistance, electromigration resistance, and stability. These compositions can be applied to an electromagnetic wave shield, electrodes for a ceramic capacitor, micro capacitor, piezo-electric element, variable resistor, thermistor or solar cell, electroconductive pastes for a chip resistor, resistance network or variable resistor, and pastes for an electroconductive circuit, and the like.

BACKGROUND ART

As electrically conductive thick film pastes, metal powder and glass frit dispersed to an organic binder and solvent, as necessary, are well known. The metal powder and glass frit are printed on a substrate such as a ceramic substrate or the like, having an excellent heat resistance baked at about 600° to 900° C. to form a thick film electric conductor. Suitable metal powder for such use includes gold powder, silver powder, platinum powder, silver-palladium powder, copper powder, and the like.

The metal powders previously used in thick film pastes, e.g., gold powder, platinum powder, silver powder, silver-palladium powder, silver-plated composite powder have the following defects. The noble metals, such as gold, platinum, silver, silver-palladium and the like, are very expensive; silver tends to cause electromigration; and silver-palladium has inferior electroconductivity. Electroconductive pastes using copper powder encounter other problems; that the electroconductivity thereof is lowered due to oxidation caused while they are preserved; the pastes tend to oxidize when baked; the atmosphere in which the pastes are baked is difficult to control and thus the yield of the pastes is bad. Further, electroconductive thick film pastes using silver-copper alloy powder composed mainly of silver and dispersed in an organic vehicle together with glass frit are disclosed [Japanese Patent Kokai (Laid-Open) SHO 62 (1987)- 140304]. The disclosure describes that silver-copper alloy powder containing 72 wt % of silver can be baked at 600° C., but this alloy is expensive because it contains a large amount of silver, and there is a tendency toward electromigration of silver.

Silver-plated copper powder is disclosed to reduce the amount of precious metal required [for example, Japanese Patent Kokai SHO 52 (1977)-71531], but this power involves problems that when the copper powder is made into paste, silver is exfoliated, electromigration occurs and electroconductivity reproduction is difficult.

DISCLOSURE OF THE INVENTION

The present invention relates to high temperature baking copper alloy compositions which have excellent electroconductivity, oxidation resistance, electromigration resistance and soldering ability and have less solder leachability.

BEST MODE FOR CONDUCTING THE INVENTION

Copper alloy powder used in the present invention is produced by atomization, including water atomization and gas atomization. In particular, copper alloy powder made by gas atomization is preferable. For example, the gas atomization is preferably that disclosed in U.S. patent application Ser. No. 07/395,531. More specifically, this process is such that a mixture of metals, such as silver and copper, and Pb if desired and the like, having a specific composition is melted by high-frequency induction heating, resistance heating, an external burner or the like in an inert gas atmosphere or in vacuo. In this case, a crucible used for this purpose is preferably made of a material which does not react with the melt at all or reacts therewith very slowly. The material is mainly composed of, for example, graphite, boron nitride, silicon carbide, quartz, magnesia, silicon nitride, and silicon carbide. Then, the melt is jetted from an end of the crucible into an inert gas atmosphere. Simultaneously with the jetting, a high speed gas stream of an inert gas is jetted against the melt, so that the melt is atomized and made into fine particles. The inert gas is a gas which does not react with the composition at all or does not substantially react therewith and includes, for example, nitrogen, helium, argon, hydrogen and mixtures thereof. A small amount of an impurity gas, such as oxygen, may be contained in the inert gas so long as it does not affect the characteristics of the copper alloy used in the present invention. The amount of oxygen in the atomizing gas is preferably 2% or less and, more preferably, 0.5% or less. A gas pressure (before expansion) is preferably 5 Kg/cm$^2$G or more, more preferably 15 Kg/cm$^2$G or more and most preferably 30 Kg/cm$^2$G or more. The speed of the high-speed gas stream is preferably 50 m/sec or more, more preferably 100 m/sec, and most preferably 300 m/sec or more, at the outlet of a gas nozzle. The mass velocity ratio of the gas to the melt is preferably 0.1 or more and more preferably 1 or more.

The copper alloy powder used in the present invention is represented by the general formula $Ag_xCu_yM_z$ (where M represents one or more metals selected from Pb, Bi and Zn; x, y and z are atomic ratio values, respectively; and $0.001 \leq x \leq 0.4$, $0.6 \leq y \leq 0.999$, $0 \leq z \leq 0.05$ and $x+y+z=1$). When x is less than 0.001, oxidation resistance cannot be sufficiently attained. When x is an amount of silver exceeding 0.4, electromigration resistance deteriorates. Thus, x is preferably $0.01 \leq x \leq 0.25$ and more preferably $0.01 \leq x \leq 0.2$. Further, M is one or more metals selected from Bi, Pb and Zn; soldering properties and intimate bonding properties are improved by using these metals. When z exceeds 0.05, electroconductivity deteriorates, and thus z is preferably $0.000003 \leq z \leq 0.05$, more preferably $0.000006 \leq z \leq 0.01$ and most preferably $0.00001 \leq z \leq 0.005$.

The copper alloy particles used in the present invention have a region in which the silver concentration near the surface of each of the particles gradually increases toward the surface of the particle. Although the silver concentration in the surface is 2.1 times or more as high as the average silver concentration, it is preferably not more than 20 times and not less than 3 times and most preferably not more than 15 times and not less 3 times. As disclosed in U.S. patent application Ser. No. 07/395,531 by the present inventors, a mechanism for the formation of the copper alloy powder used in the present invention whose feature that silver having a low melting point is condensed in the surface can be conjectured as follows, but the present invention is not of course restricted by this mechanism.

More specifically, fine metal droplets (formed by the collision of the melt with the high-speed gas stream resulting from the adiabatic expansion of a high pressure gas) are rapidly cooled and solidified while flowing at a high speed by being accompanied with the high-speed gas stream. In this solidification process, a liquid phase rich in a silver component with a low melting point is driven out to the surface and solidified later, resulting in production of particles in which silver is condensed in the surface.

When water atomization is used, the melt of this composition is jetted from the end of a crucible. Simultaneously with the jetting, pressurized water is jetted from a nozzle against the jetted melt and impacted thereagainst, so that the melt is converted to fine particles and rapidly cooled and condensed. At this time, the ratio of the mass velocity of the water to the melt is preferably 2 or more and more preferably 10 or more. Further, the speed of the water at the outlet of a water nozzle is preferably 80 m/sec and more preferably 100 m/sec or more. The pressure at which the pressurized water is jetted from the nozzle end is preferably 50 Kg/cm$^2$G and more preferably 100 Kg/cm$^2$G.

The silver concentration of the copper alloy powder used in the present invention is the atomic ratio represented by the formula $Ag/(Ag+Cu+M)$. The silver concentration, copper concentration and M concentration in and near the surface are measured by the following method by means of an XPS (an X-ray photoelectron spectrochemical analyzer). Instrument: XSAM 800 mfd. by KARATOS CO., LTD.

Specimen: A pressure-sensitive adhesive double-coated tape having electroconductivity was attached to a specimen carrier, and the powder used in the present invention was gently adhered to the double-coated tape to cover the tape completely, with caution so as not to deform the powder.

Etching Conditions: acceleration voltage of an argon ion gun; 2 kev, the angle of incidence of argon beam ions upon the surface of the sample; 45°, pressure in a chamber; 10$^{-7}$ torr, etching time; each 5 min.

Measuring Conditions of Silver Concentration: a magnesium K$\alpha$ beam (voltage; 12 kev, current; 10 mA) was irradiated and photoelectrons were taken out at an angle of 90° with respect to the sample surface at a chamber pressure of 10$^{-8}$ torr. The silver concentrations were determined by repeating the measurement and the etching alternately five times each, and the average of the first two measurements was taken as the silver concentration in the surface X.

The average concentrations of silver, copper, lead, zinc and bismuth were measured by means of an ICP (an inductively coupled plasma emission spectrochemical analyzer) by using a solution prepared by dissolving the sample in concentrated nitric acid. The average copper concentration y was the atomic ratio represented by the formula $Cu/(Ag+Cu+M)$, and the average M (one or more elements selected from lead, zinc and bismuth) concentration was the atomic ratio represented by the formula $M/(Ag+Cu+M)$.

The shape of the copper alloy particles used in the present invention is preferably a spherical shape, scaly shape or a mixture thereof, and preferably spherical particles. To obtain powder composed of scaly particles, there can be employed a method in which the copper alloy powder used in the present invention is mechanically flattened by a known method. For example, a method using a stamp mill, ball mill, vibration mill and the like is preferable. When a ball mill is used, it is preferable to convert the spherical particles to scaly particles with joint use of an inert solution, balls and the like Although the average particle size of the particles which can be used in the present invention is from 0.1 μm to 50 μm, they are preferably 0.2 to 30 μm and most preferably 0 2 to 15 μm. When the average particle size exceeds 50 μm, printability and thixotropy deteriorate, and, further, when it is less than 0.1 μm, dispersibility deteriorates and thus the particles in prepared pastes tend to be irregular. The average particle size is measured by means of a laser diffraction type particle size distribution meter SALD 1100 (mfd. by Shimazu Seisakusho Ltd.). This measurement is repeated five times by using a dispersion prepared by dispersing the powder sufficiently in an ethylene glycol solution, and the average of five measurements as an average value obtained by volume integration is taken as the average particle size.

The copper alloy powder used in the present invention is represented by the general formula $Ag_xCu_yM_z$ (Where, $0.001 \leq x \leq 0.4$, $0.6 \leq y \leq 0.999$, $0 \leq z \leq 0.05$, $x+y+z=1$; M is one or more kinds of metals selected from Pb, Bi and Zn, and x, y and z are atomic ratio values, respectively). Ag, Al, Si, Mn, Cr, Ir, Nb, Sn, Fe, Ni, Hf, Se, S, Te, In, Pd and Rh may be mixed with the copper alloy powder as a resistance adjustment agent in a powder state or an alloy component. Further, organic copper (e.g., copper carboxylate and copper dicarboxylate such as resinated copper, copper stearate, copper oleate, copper acetate, copper laurate, copper salicylate, copper citrate, copper oxalate, copper tartrate, copper caprylate, copper benzoate, and the like) organic platinum, organic palladium, organic zirconate, organic titanate, organic rhodium (e.g., carboxylate salt and dicarboxylate salt, such as acetylacetonate, palmitic acid, abietic acid, stearic acid, oleic acid, naphthoic acid and the like) may be added, as necessary, to further increase the effect of a bonding.

The glass frit which can be used in the present invention must be melted at a predetermined temperature and strongly fixes metal particles to one another and a metal electric conductor to a substrate. The compositions of the present invention can use this glass frit. For example, the combination thereof is mainly composed of $PbO-B_2O_3-ZnO$, $CaO-Al_2O_3-SiO_2$, $ZnO-B_2O_3$, $ZnO-PbO-B_2O_3-SiO_2$, $PbO-SiO_2-B_2O_3$, $B_2O_3-PbO$, $SiO_2-ZnO-BaO$, $SiO_2-ZnO-MgO$, $SiO_2-ZnO CaO$, $SiO_2-B_2O_3-MgO$, $SiO_2-B_2O_3-BaO$, $SiO_2-B_2O_3-CaO$, $SiO_2-Al_2O_3-BaO$, $SiO_2-Al_2O_3-MgO$, $SiO_2-Al_2O_3-CaO$, $SiO_2-B_2O_3-Al_2O_3$, $SiO_2-B_2O_3-Na_2O$, $SiO_2{}_1-B_2O_3-K_2O$, $SiO_2-B_2O_3-Li_2O$, $SiO_2-Na_2O$, $SiO_2-Li_2O$, $SiO_2-K_2O$, $SiO_2-B_2O_3-SrO$, $SiO_2-PbO-Na_2O$, $SiO_2-PbO-Li_2O$, $SiO_2-PbO-K_2O$, $SiO_2-B_2O_3$, $SiO_2-PbO-CaO$, $SiO_2-PbO-ZnO$, $SiO_2-B_2O_3-Bi_2O_3$. The combination is preferably mainly composed of zinc borosilicate, lead borosilicate and bismuth borosilicate. To improve an intimate bonding further, these substances may be combined with metal fine powder of bismuth oxide, manganese oxide, titanium oxide, zirconium oxide, barium oxide, beryllium oxide, copper (I) oxide, tin oxide, molybdenum oxide, vanadium oxide, neodymium oxide, cadmium oxide, iron oxide, lanthanum oxide, tungsten oxide, arsenic oxide, antimony oxide, germanium oxide, chromium oxide, trilead tetraoxide, yttrium oxide, cerium oxide, tungsten and the like, when necessary. The softening point of the glass frit is preferably not more than 900° C. and not less than 300° C. and more preferably not more than 800° C. and not less than 400° C. from the view point of intimate bonding and baking, although it depends on baking temperature. The usable structure of the glass frit may be any one of crystal, amorphous and a combination thereof so long as it is the above glass frit.

The particle size of the glass frit is preferably an average particle size of about from 0.01 to 30 $\mu$m and more preferably from 0.1 to 5 $\mu$m to obtain a sufficient baking. The average particle size described here is the average particle size measured by the above-mentioned laser diffraction method.

When the particle size is less than 0.01 $\mu$m, the glass frit tends to condense and thus workability is lowered. When the particle size exceeds 30 $\mu$m, printability is decreased.

The amount of the glass frit to be used is from 0.1 to 100 parts by weight per 100 parts by weight of copper alloy powder. When the amount of the glass frit is less than 0.1 part by weight, intimate bonding cannot be sufficiently obtained, and when it exceeds 100 parts by weight, solderability deteriorates. Thus, the amount of the glass frit to be used is preferably from 1 to 50 parts by weight and more preferably from 1 to 30 parts by weight.

A dispersing agent is optionally used in the present invention to sufficiently disperse the copper alloy powder, glass frit and necessary additives to thereby provide the composition of these components with a suitable viscosity and further to thereby improve printing performance in printing, and known organic vehicles are optionally used as the dispersing agent In particular, a substance which is decomposed or volatilized at a temperature equal to or less than the baking temperature of the composition is preferable. The organic vehicle described here is a organic binder and organic solvent, and the organic binder includes ethylcellulose, hydroxy ethylcellulose, methylcellulose, nitrocellulose and ethylcellulose derivatives, acrylic resin, butyral resin, alkyd phenol resin, epoxy resin, wood rosin and the like. The organic binder, however, is preferably ethylcellulose, acrylic resin or butyral resin. The acrylic resin preferably has a decomposition temperature of 500° C. or less and includes, for example, polymethacrylic acid-butyl, polymethacrylic acid-isobutyl, polymethacrylate of a lower alcohol and the like. The butyral resin is preferably polyvinylbutyral resin. When used in the present invention, the above substances are preferably dispersed in a suitable solvent or the like, and in this case known solvents are optionally used. Note that the above substances need not always be used and only a solvent is used as the dispersing agent if a suitable viscosity and printability can be obtained.

Although the solvent may be suitably selected from known solvents, the selected solvent is preferably less volatilized when the composition is preserved, provides a suitable viscosity, and is excellent in printing characteristics. The solvent includes, for example, ethers, such as terpinol, butylcarbitol, ethylcarbitol, methylcarbitol, ethylcellosolve, butylcellosolve and the like; esters, such as butylcellosolve acetate, ethylcarbitol acetate, methylcarbitol acetate, ethylcellosolve acetate, butylcellosolve acetate, ethyl acetate, butyl acetate and the like; ketones, such as methyl ethyl ketone, methyl isobutyl ketone and the like; and hydrocarbons such as n-methyl pyrrolidone, mineral spirit, toluene, xylene and the like.

The dispersing agent may be used in an amount which does not injure viscosity and electric conductivity and, for example, the amount of from 50 to 1 part by weight of the dispersing agent is used for 100 parts by weight of copper alloy powder.

The composition of the present invention is optionally combined with additives such as a lubricant, antioxidant, viscosity adjusting agent and the like, when necessary. Plasticizer, for example, silane coupling agent (e.g., tri-chloropropyl-trimethoxy silane, vinyl-trichloro silane and vinyl-triethoxy silane), aluminium coupling agent, titanium coupling agent, soybean lecithin, diethanol-amine, triethanol amine, tributylphosphate, micro-wax having a number of carbons from 20 to 50, paraffin having a number of carbons from 20 to 35, stearic acid, oleic acid, dioctyl phthalate and the like, may be added. Further, antioxidant including phenol derivatives, such as monocarbonic acid having a number of carbons up to 20, dicarbonic acid, pyrocatechol, methyl hydroxyquinone, hydroxyquinone, phenol and the like, acetyl acetone and the like is also optionally added. The amount of the lubricant, antioxidant, viscosity adjusting agent and stabilizer used is preferably 50 parts by weight or less, more preferably 20 parts by weight and most preferably 10 parts by weight, per 100 parts by weight of copper alloy powder. When the compositions of the present invention are used, these components are preferably sufficiently mixed with the above substances and may be mixed therewith by using a known method. For example, an automoted mortar, kneader, three roller grinding mill, mixer and the like may be used. Note, the mixing method is not limited thereto The preferable viscosity of the composition measured by, for example, Brookfield HBT Viscometer # 5 Spindle at 15 rpm and at 25° C. is preferably 500 Pa·s or less and more preferably 300 Pa·s or less.

Known methods such as a screen printing, doctor blade method, gravure method, flexure method, offset method, magnetoner method and the like may be used to print the composition of the present invention. A substrate on which the composition is printed is preferably a ceramic substrate mainly composed of alumina, forsterite, stearite, cordierite, mullite, aluminum nitride, silicon carbide and the like. Stainless substrate, enamel substrate and glass substrate are further alternatives.

When the composition of the present invention is baked, the baking temperature is preferably sufficient to cause copper alloy powder and glass frit to be sintered and, for example, from 500° to 900° C. and more preferably from 600° to 850° C. The baking atmosphere is preferably an inert baking atmosphere, but a small amount of oxygen is preferably contained therein to sufficiently burn out any dispersing agent. The additive amount of oxygen is preferably 1% or less, more preferably 1000 ppm or less and most preferably 100 ppm or less.

The composition of the present invention containing copper alloy power has a structure in which a large amount of silver is crystallized in the surface thereof regardless of that the composition contains only a small amount of silver, and thus the composition has great oxidation resistance. Further, since the composition can be baked in a burn out region in a highly concentrated oxygen atmosphere, not only is the yield of products increased but also a matching with ruthenium resistance pastes is achieved.

Further, since the obtained baked film itself has a stabilized compound of silver and copper formed in the film, an excellent effect for preventing electromigration can be achieved thereby.

The characteristics of the composition of the present invention were measured and evaluated by testing the electroconductivity, soldering property, bonding strength, natural solder leachability, and electromigration thereof.

The electroconductivity was determined by using a four-probe technique from the sheet resistivity of an electric conductor of 10 mm×50 mm.

To measure the bonding strength, a flux was placed on a film of 2 mm×2 mm baked on a substrate, a stainless wire of 20 gauge was soldered to the film wit a Pb/Sn eutectic solder and pulled in a direction perpendicular to the substrate, and then the bonding strength was measured when the stainless wire was exfoliated. Samples having the bonding strength of 3 Kg/4 mm$^2$ were judged as acceptable.

The solderability was measured by preparing a baked film of 10 mm×10 mm, coating a flux on the entire surface of the film, dipping the film was dipped in a Pb/Sn eutectic solder bath (230° C.) for 10 seconds, and the area thereof wetted by the solder was measured To measure the solder leachability, a baked film of 200 μm×50 mm was formed on an alumina substrate and dipped in a Pb/Sn eutectic solder bath kept at 230° C. for 10 seconds each cycle, and the number of cycles at which the soldered film was insulated was measured.

Electromigration was tested by forming electric conductors at a distance of 1 mm from each other, adding 0.2 ml of a water drop between the electric conductors, and measuring elapsed time before a leakage current reached 100 μA after a direct current of 10 V was applied across the electric conductors.

EXAMPLES

Examples of Powder Production

Example 1

In a boron nitride crucible, 5.35 g of silver particles (average particle size of 2 mm in diameter; the same applied in the following examples), 314.0075 g of copper particles (average particle size of 3 mm in diameter; the same applied in the following examples), and 1.045 g of bismuth particles (average particle size of 2 mm in diameter; the same applied in the following examples) were heated up to 1700° C. by high-frequency induction heating and melted in a nitrogen gas atmosphere (99.9 % or more). After being melted, the melt was jetted (from a nozzle attached to an end of the crucible) into a nitrogen gas atmosphere. At the same time, nitrogen gas (99.9 % or more) was jetted with a gas pressure of 30 Kg/cm$^2$G against the melt (under the conditions of a mass velocity ratio of the gas to the melt of 0.7) to atomize the melt. At this time, the linear velocity of the gas at the outlet of the gas nozzle was 150 m/sec. The obtained powder was composed of spherical particles having an average particle size of 16 μm. The silver concentrations of the powder near the surface were 0.0916, 0.084, 0.072, 0.060 and 0.058, starting from the surface of the particles; the silver concentration x in the surface was 0.0878, the average silver concentration was x=0.01, and thus the silver concentration in the surface was 8.78 times the average silver concentration. Further, the average copper concentration was y=0.989, and the average bismuth concentration was z=0.001.

Example 2

In a graphite crucible, 210.405 g of silver particles, 193.675 g of copper particles and 0.00653 g of zinc particles (average particle size of 1 mm in diameter; the same applied in the following examples) were heated in the same way up to 1700° C. by high-frequency induction heating and melted in a nitrogen gas atmosphere (99.9 % or more). The obtained melt was jetted from a nozzle attached to an end of the crucible into a nitrogen gas atmosphere (99.9 % or more). Simultaneously with the jetting, nitrogen gas (99.9 % or more) was jetted with a gas pressure of 15 Kg/cm$^2$G against the melt (under the conditions of a mass velocity ratio of the gas to the melt of 2) to atomize the melt. At this time, the linear velocity of the gas at the outlet of the gas nozzle was 80 m/sec. The obtained powder was composed of spherical particles having an average particle size of 20 μm. The silver concentrations of the powder near the surface were 0.88, 0.84, 0.82, 0.80 and 0.76, starting from the surface of the particles, the silver concentration x in the surface was 0.86. Further, the average silver concentration was x=0.39, and thus the silver concentration in the surface was 2.20 times the average silver concentration. Further, the average copper concentration was y=0.60999, and the average zinc concentration was z=0.00001.

Example 3

In a boron nitride crucible, 210.405 g of silver particles, 192.0875 g of copper particles, and 5.18 g of lead particles (average particle size of 3 mm in diameter; the same applied in the following examples) were heated up to 1800° C. by high-frequency induction heating and melted in a helium gas atmosphere (99.9 % or more). The obtained melt was jetted from a nozzle attached to an end of the crucible into a helium gas atmosphere (99.9 % or more). At the same time, helium gas (99.9 % or more) was jetted with a gas pressure of 15 Kg/cm$^2$G against the melt (under the conditions of a mass velocity ratio of the gas to the melt of 0.3) to atomize the melt At this time, the linear velocity of the gas at the outlet of the gas nozzle was 160 m/sec. The obtained powder was composed of spherical particles having an average particle size of 10 μm. The silver concentrations of the powder near the surface were 0.9, 0.88, 0.82, 0.78 and 0.74, starting from the surface of the particles, the silver concentration x in the surface was 0.89 and the average silver concentration was x= 0.39; thus the silver concentration in the surface was 2.28 times the average silver concentration. Further, the average copper concentration was y=0.605, and the average lead concentration was z=0.005.

Example 4

In a graphite crucible, 26.975 g of silver particles, 301.59325 g of copper particles and 0.03265 g of zinc particles were heated up to 1750° C. by high-frequency induction heating and melted in a nitrogen gas atmosphere (99.9 % or more). The obtained melt was jetted from a nozzle attached to an end of the crucible into a nitrogen gas atmosphere (99.9 % or more). Simultaneously with the jetting, nitrogen gas (99.9 % or more) was jetted with a gas pressure of 40 Kg/cm$^2$G against the melt (under the conditions of a mass velocity ratio of the gas to the melt of 2.1) to atomize the melt. At this time, the linear velocity of the gas at the outlet of the gas nozzle was 160 m/sec. The obtained powder was composed of spherical particles having an average particle size of 14 μm. The silver concentrations of the powder near the surface were 0.58, 0.46, 0.38, 0.25 and 0.1, starting from the surface of the particles, the silver concentration x in the surface was 0.52, and the average silver concentration was x=0.05; thus the silver concentration in the surface was 10.4 times the average silver concentration. Further, the average copper concentration was y=0.9499, and the average zinc concentration was z=0.0001.

Example 5

In a boron nitride crucible, 53.95 g of silver particles, 285.7468 g of copper particles, 0.00518 g of lead particles and 0.0016325 g of zinc particles were heated up to 1700° C. by high-frequency induction heating and melted in a nitrogen gas atmosphere (99.9 % or more). The obtained melt was jetted from a nozzle attached to an end of the crucible into a nitrogen gas atmosphere (99.9 % or more). Simultaneously with the jetting, nitrogen gas (99.9 % or more) was jetted with a gas pressure of 50 Kg/cm$^2$G against the melt (under the conditions of a mass velocity ratio of the gas to the melt of 2.3) to atomize the melt. At this time, the linear velocity of the gas was 180 m/sec. The obtained powder was composed of spherical particles having an average particle size of 13 μm. The silver concentrations of the powder near the surface were 0.8, 0.77, 0.65, 0.54 and 0.43, starting from the surface of the particles, and the silver concentration x in the surface was 0.785. Further, the average silver concentration was x=0.1; thus the silver concentration in the surface was 7.85 times the average silver concentration. Further, the average copper concentration was y=0.89999, and the average (lead+zinc) concentration was z=0.00001.

Examples of Paste

Example 6

10 g of particles obtained in Example 1 with a particle size of 5 μm or less among particles constituting the powder (x=0.01, y=0.989, z=0.001, average particle size: 2.5 μm), 2 g of PbO-B$_2$O$_3$-ZnO glass frit, 0.1 g of BaO-SiO$_2$-ZnO glass frit, 0.1 g of SiO$_2$-B$_2$O$_3$-Na$_2$O glass frit and 0.5 g of acrylic resin were dispersed into 3 g of terpinol and 0.1 g of xylenol. The obtained composition was used to print five lines of 100 μm×50 mm on an alumina substrate with a screen (270 mesh). Then, the coated film was baked by using a continuous baking furnace manufactured by Watkins & Johnson. The baking conditions were as follows after organic substances of the coated film were burned out in a nitrogen atmosphere containing 10 ppm of oxygen from raising from room temperature to 550° C. for 15 minutes, the coated film was further baked for 10 minutes in the nitrogen atmosphere after the temperature was raised to 600° C. Thereafter, the coated film was cooled to the room temperature in the nitrogen atmosphere. The obtained coated film had a volume resistivity of 3×10$^{-6}$ ohm·cm and migration time was 230 seconds. Further, solder wetting was 96% and solder leaching was hardly observed even after dipping in solder bath 20 times. In addition, bonding strength was 5 Kg/4 mm$^2$.

Example 7

10 g of particles obtained in Example 2 with a particle size of 5 μm or less among particles constituting the powder (x=0.39, y=0.60999, z=0.00001, average particle size: 2 μm, 0.5 g of PbO-CaO-Ba$_2$O$_3$ glass frit and 0.4 g of ethylcellulose were dispersed into 3 g of butylcellosolve, 0.1 g of ethylcellosolve, 0.1 g of ethyl acetate and 0.1 g of acetone. The obtained composition was screen printed (320 mesh) on an alumina substrate. Then, the coated film was baked by using the same baking furnace as that of Example 6 under the following conditions: after organic substances of the coated film were burned out in a nitrogen atmosphere containing 10 ppm of oxygen for 15 minutes from room temperature to 550° C., the coated film was further baked for 10 minutes in the nitrogen atmosphere after the temperature of the coated film was increased to 850° C. Thereafter, the coated film was cooled to the room temperature in the nitrogen atmosphere. The obtained baked film had a volume resistivity of 2.5×10−6 ohm·cm, migration time was 100 seconds, solder wetting was 98%, and solder leaching was hardly observed even after dipping in solder bath 20 times. Further, a bonding strength was 5.2 Kg/4 mm$^2$.

Example 8

10 g of particles obtained in Example 3 with a particle size of 5 μm or less among particles constituting the powder (x=0.39, y=0.605, z=0.005, average particle size: 1.9 μm), 0.6 g of PbO-SiO$_2$-MgO glass frit and 0.1 g of SiO$_2$-B$_2$O$_3$-K$_2$O glass frit were dispersed into 4 g of terpinol, 0.1 g of methycarbitol and 0.1 g of ethylcarbitol. The obtained composition was screen printed (250 mesh) on an alumina substrate. Then, a coated film was baked by using the same baking furnace under the following conditions: after organic substances of the coated film were decomposed or burned out in a nitrogen atmosphere containing 100 ppm of oxygen for 15 minutes from room temperature to 550° C., the coated film was further baked for 10 minutes in the nitrogen atmosphere after the temperature of the coated film was increased to 600° C. Thereafter, the coated film was cooled to the room temperature in the nitrogen atmosphere. The baked film had a volume resistivity of 2.5×10$^{-6}$ ohm·cm, migration time was 100 seconds, solder wetting was 99%, and solder leaching was hardly observed even after dipping in solder bath 20 times.

Example 9

10 g of particles obtained in Example 4 with a particle size of 5 μm or less among particles constituting the powder (x=0.05, y=0.9499, z=0.0001, average particle size: 2.3 μm), 3 g of PbO-Al$_2$O$_3$-B$_2$O$_3$ glass frit, 0.1 g of SiO$_2$-B$_2$O$_3$-Bi$_2$O$_3$ glass frit, 0.1 g of SiO$_2$-B$_2$O$_3$-SrO glass frit, 0.1 g of methylcellulose and 0.1 g of copper oxide were dispersed into 2 g of butylcarbitol acetate, 0.1 g of xylene and 0.1 g of methyl ethyl ketone. The obtained composition was coated on an alumina substrate by a screen printing (250 mesh). Then, a coated film was baked by using the same baking furnace under the same conditions as that of the preceding example. The obtained baked film had a volume resistivity of 3×10$^{-6}$ ohm·cm, migration time was 150 seconds, solder wetting was 99%, and solder leaching was hardly observed even after dipping in solder bath 20 times. In addition, bonding strength was 4.8 Kg/4 mm$^2$.

Example 10

10 g of particles obtained in Example 5 with a particle size of 5 μm or less among particles constituting the powder (x=0.1, y=0.89999, z=0.00001, average particle size: 2 μm), 1 g of PbO-MgO-SiO$_2$ glass frit, 0.2 g of acrylic resin, 2 g of bismuth oxide and 0.1 g of cadmium oxide were dispersed into 3 g of butylcarbitol, 3 g of toluene and 5 g of methyl ethyl ketone. The obtained composition was screen printed on an alumina substrate. Then, the coated film was baked by using the same baking furnace under the same conditions as those of Example 8. The obtained baked film had a volume resistivity of $3 \times 10^{-6}$ ohm·cm, a solder property was 98%, migration time was 130 seconds. Solder leaching was hardly observed even dipping in solder bath 20 times. Further, bonding strength was 5.1 Kg/4 mm$^2$.

Example 11

10 g of particles obtained in Example 5 with a particle size of 10 μm or less among particles constituting the powder (x=0.1, y=0.89999, z=0.00001, average particle size: 2 μm), 0.4 g of SiO$_2$-B$_2$O$_3$-Bi$_2$O$_3$ glass frit, 0.5 g of SiO$_2$-PbO-Li$_2$O glass frit, 0.05 g of copper (I) oxide, 0.1 g of trilead tetraoxide, 0.02 g of phenol resin, 0.02 g of alkydphenol resin, 0.03 g of butyral resin were dispersed in 1 g of n-methyl pyrrolidone, 0.5 g of butyl acetate and 1 g of ethyl cellosolve acetate added with each small amount of triethanolamine (0.01 g), silane coupling agent (0.001 g) and pyrocatechol (0.01 g). The obtained composition was screen printed on an alumina substrate. Then, the coated film was baked by using the same baking furnace as that of Example 6 under the same conditions as those of Example 6. The obtained baked film had a volume resistivity of $3 \times 10^{-6}$ ohm·cm, good solder wetting of 96%, and solder leaching did not occur even after dipping in solder bath 20 times.

Further, a coated film of 4 cm $\times$ 4 cm was screen printed on an alumina substrate of 5 cm $\times$ 5 cm and 0.8 mm thick in the same way. After printing, the coated film was baked under the same conditions as those of Example 6. When the electromagnetic wave shield characteristics of the obtained coated film were measured by a waveguide, a shield effect of 60 dB was obtained. Further, when the baked film was measured in the same way after the baked film had been subjected to an environmental temperature change from 125° C. to −55° C. for 1000 cycles, the shield effect of 60 dB was similarly obtained.

Example 12

10 g of particles obtained in Example 5 with a particle size of 5 μm or less among particles constituting the powder (x=0.1, y=0.89999, z=0.00001, average particle size 2 μm), 1 g of SiO$_2$-B$_2$O$_3$ glass frit, 0.5 g of SiO$_2$-PbO-ZnO glass frit, 0.01 g of resinated copper, 0.2 g of alkyd resin, 0.1 g of an ethylcellulose derivative and 0.1 g of wood rosin were dispersed into 1 g of methyl isobutyl ketone and 1 g of terpinol together with each small amount of titanium coupling agent (0.001 g) and pyrocatechol (0.01). The obtained composition was screen printed on an alumina substrate. Then, the coated film was baked by using the same baking furnace as that of Example 6 under the same conditions. The obtained baked film had a volume resistivity of $2 \times 10^{-6}$ ohm·cm, migration time was 130 seconds, solder wetting was 99%, and solder leaching was not observed even after dipping in solder bath 20 times. Further, bonding strength was 5.3 Kg/4 mm$^2$.

Example 13

25 10 g of particles obtained in Example 5 with a particle size of 5 μm or less among particles constituting the powder (x=0.1, y=0.89999, z=0.00001), 1.2 g of PbO-B$_2$O$_3$-ZnO glass frit, 0.2 g of acrylic resin and 2 g of butylcarbitol were thoroughly mixed, and the mixture having the above composition was screen printed at the opposite ends of a ruthenium resistance (5 mm $\times$ 50 mm x 0.02 mm thick) which was previously screen printed and baked to form electrodes of 5 mm $\times$ 5 mm. After printing, the mixture was baked under the same conditions as those of Example 7. When the resistance value of the opposite ends of the baked film was measured, the rate of change of the resistance value of the ruthenium resistance was within 1% and exhibited a very good matching property Example 14

10 g of particles obtained in Example 5 with a particle size of 10 μm or less among particles constituting the powder (x=0.1, y=0.89999, z=0.00001), 2 g of PbO-SiO$_2$-B$_2$O$_3$ glass frit having an average particle size of 2 μm, 0.5 g of acrylic resin and 2 g of butylcarbitol were thoroughly mixed and made into a paste. The paste was coated as the external electrodes of a ceramic capacitor of 3 mm $\times$ 3 mm and baked under the same conditions as those of Example 6. The obtained electrodes had a good electric conductivity and were not exfoliated from the capacitor even after they were repeatedly subjected to a heat cycle from 125° C. to −55° C. 1000 times. Further, capacitance was not reduced by a migration.

Comparative Examples of Powder Production

Comparative Example 1

In a graphite crucible, 0 37765 g of silver particles and 317.27775 g of copper particles were heated up to 1700° C. by high-frequency induction heating and melted in a nitrogen gas atmosphere (99.9% or more). The obtained melt was jetted from a nozzle attached to an end of the crucible, and at the same time nitrogen gas (99.9% or more) was jetted with a gas pressure of 20 Kg/cm$^2$G against the melt (at a mass velocity ratio of the gas to the melt of 2) to atomize the melt. At this time, the linear velocity of the gas at the outlet of the gas nozzle was 100 m/sec. The obtained powder was composed of spherical particles having an average particle size of 20 μm. The average silver concentration was x =0.0007, and the average copper concentration was y =0.9993.

Comparative Example 2

In a boron nitride crucible, 0 37765 g of silver particles, 317.277 g of copper particles and 0.001045 g of bismuth particles were heated up to 1700° C. by high-frequency induction heating and melted in a nitrogen gas atmosphere (99.9% or more). The obtained melt was jetted from a nozzle attached to an end of the crucible, and simultaneously with the jetting, nitrogen gas (99.9% or more) was jetted with a gas pressure of 30 Kg/cm$^2$G against the melt (at a mass velocity ratio of the gas to the melt of 2.1) to atomize the melt. At this time, the linear velocity of the gas at the outlet was 150 m/sec. The obtained powder was composed of spherical particles having an average particle size of 19 μm. The average silver concentration was x =0.0007, the average copper concentration was y =0.999299, and the average bismuth concentration was z =0.000001.

Comparative Example 3

In a graphite crucible, 242.775 g of silver particles and 206.375 g of copper particles were heated up to 1700° C. by high-frequency induction heating and melted in a nitrogen gas atmosphere (99.9% or more). The obtained melt was jetted from a nozzle attached to an end of the crucible, and simultaneously with the jetting, nitrogen gas (99.9% or more) was jetted with a gas pressure of 40 Kg/cm$^2$G against the melt (at a mass velocity ratio of the gas to the melt of 1.4) to atomize the melt. At this time, the linear velocity of the gas at the outlet was 150 m/sec. The obtained powder was composed of spherical particles having an average particle size of 18 μm. The average silver concentration was x =0.45, and the average copper concentration was y =0.65.

Comparative Example 4

In a boron nitride crucible, 242.775 g of silver particles, 149.225 g of copper particles and 82.88 g of lead particles were heated up to 1800° C. by high-frequency induction heating and melted in a nitrogen gas atmosphere (99.9% or more). The obtained melt was jetted from a nozzle attached to an end of the crucible and at the same time, air (with a gas pressure of 30 Kg/cm$^2$G) was jetted against the melt (at a mass velocity ratio of the gas to the melt of 3) to atomize the melt. At this time, the linear velocity of the gas at the outlet was 150 m/sec. The obtained powder was composed of spherical particles having an average particle size of 20 microns. The average silver concentration was x =0.45, the average copper concentration was y =0.47, and the average lead concentration was z =0.08. At this time, the silver concentrations of the particles near the surface was 0.02, 0.03, 0.06, 0.08 and 0.12, starting from the surface of the particles; the silver concentration x in the surface was 0.025, and 0.55 times the average silver concentration; thus silver was rather less concentrated in the surface.

Comparative Example 5

In a boron nitride crucible, 53.95 g of silver particles, 254 g of copper particles and 103.6 g of lead particles were heated up to 1800° C. by high-frequency induction heating and melted in a nitrogen gas atmosphere (99.9% or more). The obtained melt was jetted from a nozzle attached to an end of the crucible into a nitrogen atmosphere, and, at the same time, nitrogen gas (99.9% or more) was jetted with a gas pressure of 30 Kg/cm$^2$G against the melt (at a mass velocity ratio of the gas to the melt of 2) to atomize the melt. At this time, the linear velocity of the gas at the outlet was 140 m/sec. The obtained powder was composed of spherical particles having an average particle size of 20 μm. The average silver concentration was x =0.1, the average copper concentration was y =0.8, and the average lead concentration was z =0.1.

Comparative Example 6

In a boron nitride crucible, 377.65 g of silver particles, 31.75 g of copper particles and 118.7 g of tin particles were heated up to 1800° C by high-frequency induction heating and melted in a nitrogen gas atmosphere (99.9% or more). The obtained melt was jetted from a nozzle attached to an end of the crucible into air, at the same time, air was jetted with a gas pressure of 30 Kg/cm2G against the melt (at a mass velocity ratio of the gas to the melt of 2) to atomize the melt. At this time, the linear velocity of the gas at the outlet was 135 m/sec. The obtained powder was composed of spherical particles having an average particle size of 24 μm. Further, the silver concentrations of the particles near the surface were 0.08, 0.13, 0.15, 0.2 and 0.22, starting from the surface of the particles, the silver concentration x in the surface was 0.105, the average silver concentration was x =0.7, and thus the silver concentration in the surface was 0.15 times the average silver concentration, and no concentration of silver was observed. Further, the average copper concentration was y =0.1, and the average tin concentration was z =0.2.

Comparative Example 7

In a boron nitride crucible, 53.95 g of silver particles, 254 g of copper particles and 59.35 g of tin particles were heated up to 1750° C. by high-frequency induction heating and melted in a nitrogen gas atmosphere (99.9% or more). The obtained melt was jetted from a nozzle attached to an end of the crucible into air. Simultaneously with the jetting, air was jetted with a gas pressure of 30 Kg/cm$^2$G against the melt (under the conditions of a mass velocity ratio of the gas to the melt of 2) to atomize the melt. At this time, the linear velocity of the gas at the outlet was 120 m/sec. The obtained powder was composed of spherical particles having an average particle size of 23 μm. The silver concentrations of the particles near the surface were 0.01, 0.03, 0.05, 0.08 and 0.10, starting from the surface of the particles. The average silver concentration was x =0.02, the average copper concentration was y =0.8, the average tin concentration was z =0.1, the silver concentration in the surface was 0.2 times the average silver concentration, and no surface concentration of silver was observed. Further, 50% or more of tin was concentrated in the surface, and copper in the surface was oxidized.

Comparative Example 8

In a boron nitride crucible, 26.975 g of silver particles, 254 g of copper particles and 32.65 g of zinc particles were heated up to 1800° C. by high-frequency induction heating and melted in a nitrogen gas atmosphere (99.9% or more). The obtained melt was jetted from a nozzle attached to an end of the crucible into a nitrogen atmosphere. At the same time, nitrogen gas (99.9% or more) was jetted with a gas pressure of 2 Kg/cm$^2$G against the melt (at a mass velocity ratio of the gas to the melt of 2) to atomize the melt. At this time, the linear velocity of the gas at the outlet was 10 m/sec. The obtained powder was composed of spherical particles having an average particle size of 150 μm. The average silver concentration was x =0.1, the average copper concentration was y =0.8, and the average zinc concentration was z =0.1.

Comparative Example of Paste

Comparative Example 9

10 g of particles obtained in Comparative Example 1 with a particle size of 5 μm or less among particles constituting the powder (x =0.0007, y =0.9993, an average particle size: 2 μm), 2 g of PbO-SiO$_2$-ZnO glass frit and 0.2 g of ethylcarbitol. The composition was coated on an alumina substrate by screen printing (250 mesh). The coated film was baked under the same conditions as those of Example 6. The baked film had a volume resistivity of $8 \times 10^{-5}$ ohm·cm, and poor solder wetting of 60%.

Comparative Example 10

10 g of particles obtained in Comparative Example 2 with a particle size of 5 μm or less among particles constituting the powder (x =0.0007, y =0.999299, z =0.000001, average particle size: 3 μm), 2 g of PbO-B$_2$O$_3$-ZnO glass frit and 0.4 g of methylcellulose were dispersed into 3 g of terpinol. The obtained composition was coated on an alumina substrate by a screen printing (325 mesh). The coated film was baked under the same conditions as those of Example 7. The baked film had a volume resistivity of $9 \times 10^{-6}$ ohm·cm and poor solder wetting property of 57%.

Comparative Example 11

10 g of particles obtained in Comparative Example 3 with a particle size of 5 μm or less among particles constituting the powder (x =0.45, y =0.65, an average particle size: 2.5 μm), 1 g of PbO-Al$_2$O$_3$-SiO$_2$ glass frit and 0.4 g of ethylcellulose were dispersed into 4 g of terpinol. The obtained composition was screen printed on an alumina substrate. The coated film was baked under the following conditions: after organic substances of the coated film were burned out in a nitrogen atmosphere containing 100 ppm of oxygen raising from room temperature to 550° C. for 15 minutes, the coated film was further baked for 10 minutes in the nitrogen atmosphere after the temperature of the coated film was increased to 700° C. Thereafter, the coated film was cooled to room temperature in the nitrogen atmosphere. The baked film had a volume resistivity of $5 \times 10^{-6}$ ohm·cm and solder wetting of 99%, but it had migration time of 45 seconds and thus easily caused migration. Further, solder leaching occurred 5 times.

Comparative Example 12

10 g of particles obtained in Comparative Example 4 with a particle size of 5 μm or less among particles constituting the powder (x =0.45, y =0.47, z =0.08, an average particle size: 1.5 μm), 1 g of PbO-B$_2$O$_3$-SiO$_2$ glass frit and 0.45 of ethylcellulose were dispersed into 3 g of terpinol. The obtained composition was screen printed on an alumina substrate. The coated film was baked under the same conditions as those of Example 8. The baked film had a volume resistivity of $3.5 \times 10^{-6}$ ohm·cm and solder wetting of 98%, but it had a short migration time of 45 seconds.

Comparative Example 13

10 g of particles obtained in Example 5 with a particle size of 5 μm or less among particles constituting the powder (x =0.1, y =0.8, z =0.1, an average particle size 3 μm) and 10 g of PbO-SiO$_2$-ZnO glass frit were dispersed into 4 g of butylcarbitol. The obtained composition was screen printed on an alumina substrate. The coated film was baked under the same conditions as those of Example 6. The baked film had a migration time of 130 seconds but had a high volume resistivity of $3 \times 10^{-5}$ ohm·cm.

Comparative Example 14

10 g of particles obtained in Comparative Example 6 with a particle size of 5 μm or less among particles constituting the powder (x =0.7, y =0.1, z =0.2, an average particle size: 2 μm), 2 g of PbO-SiO$_2$-ZnO glass frit and 0.3 of ethylcellulose were dispersed into terpinol. The obtained composition was coated on an alumina substrate by using a screen printing (250 mesh). The coated film was baked under the same conditions as those of Example 6. The baked film had a high volume resistivity of $4 \times 10^{-5}$ ohm·cm.

Comparative Example 15

10 g of particles obtained in Example 1 with a particle size of 5 μm or less among particles constituting the powder (x =0.01, y =0.989, z =0.001, an average particle size: 3 μm), 0.001 g of PbO-SiO-ZnO glass frit (0.01 part by weight per 100 parts by weight of powder) and 0.3 g of ethylcellulose were dispersed into 2 g of butylcarbitol. The obtained composition was screen printed on an alumina substrate and baked in a nitrogen atmosphere containing 100 ppm of oxygen at 600° C. for 10 minutes. The obtained baked film had a volume resistivity of $3 \times 10^{-6}$ ohm·cm, but was easily exfoliated (bonding strength 0.1 Kg/4 mm$^2$ or less).

Comparative Example 16

10 g of particles obtained in Example 4 with a particle size of 5 μm or less among particles constituting the powder (x =0.05, y =0.9499, z =0.0001, an average particle size: 3 μm), 0.3 g of PbO-B$_2$O$_3$-Al$_2$O$_3$glass frit were dispersed into 20 g of acrylic resin and 20 g of butylcarbitol (400 parts by weight of an organic binder and solvent per 100 parts by weight of powder). The obtained composition was screen printed on an alumina substrate. The coated film was baked under the same conditions as those of Example 8, with the result that the obtained baked film had a high volume resistivity of $4 \times 10^{-4}$ ohm·cm and further carbons were contained therein

Comparative Example 17

10 g of particles obtained in Example 1 with a particle size of 5 μm or less among particles constituting the powder (x =0.01, y =0.989, z =0.001, an average particle size: 1.7 μm), 20 g of SiO$_2$-B$_2$O$_3$ glass frit and 0.2 g of acrylic resin were thoroughly dispersed into 2 g of acetone and 1 g of butylcarbitol. The obtained composition was screen printed (300 mesh) on an alumina substrate. The coated film was baked under the same conditions as those of Example 8. The obtained baked film had a high volume resistivity of $3 \times 10^{-3}$ ohm·cm.

Comparative Example 18

10 g of particles obtained in Comparative Example 7 with a particle size of 10 μm or less among particles constituting the powder (x =0.1, y =0.8, z =0.1, an average particle size: 6 μm), 2 g of SiO$_2$-B$_2$O$_3$-ZnO glass frit and 0.2 g of ethylcellulose were thoroughly dispersed into 3 g of terpinol. The obtained composition was screen printed (250 meshes) on an alumina substrate. The coated film was baked under the same conditions as those of Example 7, with the result that the obtained baked film had a high volume resistivity of $5 \times 10^{-3}$ ohm·cm and further was immediately exfoliated.

Comparative Example 19

10 g of particles obtained in Comparative Example 8 with a particle size of 100 μm or more among particles constituting the powder (x =0.05, y =0.949, z =0.001, an average particle size: 180 μm), 2 g of PbO-B$_2$O$_3$-SiO$_2$ glass frit and 0.4 g of ethylcellulose were thoroughly dispersed into 3 g of ethylcellosolve. The obtained composition was screen printed (50 mesh) on an alumina substrate. The coated film was baked under the same conditions as those of Example 7, with the result that the obtained baked film had a high volume resistivity of $1\times10^{-2}$ ohm·cm and thus almost not baked.

INDUSTRIAL APPLICABILITY

The present invention relates to less expensive electroconductive compositions which have excellent electroconductivity, oxidation resistance, electromigration resistance, solder wetting, solder leachability resistance and stability. These compositions can be applied to electromagnetic wave shields, electrodes for ceramic capacitors, micro capacitors, piezo-electric elements, variable resistors, thermistors, or solar cells, electroconductive pastes for chip resistors, resistance networks, or variable resistors, and pastes for conductive circuits, and the like.

We claim:

1. A composition, comprising 100 parts by weight of copper alloy powder represented by a general formula $Ag_xCu_yM_z$ (where $0.001 \leq x \leq 0.4$, $0.6 \leq y \leq 0.999$, $0.000003 \leq z \leq 0.05$, $x+y+z = 1$; where M represents one or more metals selected from the group consisting of Pb, Bi and Zn; and x, y and z are atomic ratio values, respectively) particles of which have a particle surface silver concentration higher than the average silver concentration thereof and a region in which a silver concentration increases toward the particle surface, 0.1 to 50 parts by weight of glass frit and an organic vehicle.

2. A composition according to claim 1, wherein the silver concentration in the surface of particles of said copper alloy powder is 2.1 times the average silver concentration.

3. A composition according to claim 1, wherein the average particle size of said copper alloy powder is from 0.1 to 50 μm and the shape thereof is a spherical shape, scaly shape or a mixture thereof.

4. A composition according to claim 1, wherein said copper alloy powder is obtained by rapid cooling to condense it by atomization.

5. A composition according to claim 1 wherein said organic vehicle is at least one member selected from the group consisting of ethylcellulose, acrylic resin, methylcellulose, hydroxy ethylcellulose, derivatives of ethylcellulose, alkyd resin, butyral resin, epoxy resin, phenol resin, alkyd phenol resin and wood rosin.

6. A composition according to claim 1, wherein said organic vehicle is methylcarbitol, ethylcarbitol, butylcarbitol or acetate thereof, ethylcellosolve, butylcellosolve, terpinol, toluene, xylene, methyl ethyl ketone, ethyl acetate, acetone or xylenol.

7. A composition according to claim 1, wherein said organic vehicle is contained in the ratio of 1 to 300 parts by weight per 100 parts by weight of said copper alloy powder.

8. A composition according to claim 1, wherein said glass frit is mainly composed of at least one member selected from the group consisting of PbO, $B_2O_3$, ZnO, $SiO_2$, CaO, $Al_2O_3$, BaO, $Bi_2O_3$, $Na_2O$, $K_2O$, SrO and MgO.

9. A paste for screen printing composed of a composition according to claim 1.

10. A paste for an electroconductive circuit composed of a composition according to claim 1.

11. A paste for an electrode composed of a composition according to claim 1.

12. A paste for an electromagnetic wave shield composed of a composition according to claim 1.

13. An electroconductive paste for a resistance contact composed of a composition according to claim 1.

* * * * *